(12) United States Patent
Tseng

(10) Patent No.: US 9,825,207 B2
(45) Date of Patent: Nov. 21, 2017

(54) LIGHT-EMITTING DIODE PACKAGING ELEMENT FOR CONTROLLING COLOR TEMPERATURE OF LIGHTS

(71) Applicant: Edison Opto Corporation, New Taipei (TW)

(72) Inventor: Kuo-Feng Tseng, New Taipei (TW)

(73) Assignee: EDISON OPTO CORPORATION, New Taipei (TW)

( * ) Notice: Subject to any disclaimer, the term of this patent is extended or adjusted under 35 U.S.C. 154(b) by 0 days.

(21) Appl. No.: 15/069,983

(22) Filed: Mar. 15, 2016

(65) Prior Publication Data

US 2016/0284950 A1    Sep. 29, 2016

(30) Foreign Application Priority Data

Mar. 26, 2015 (TW) .............................. 104109809 A

(51) Int. Cl.
  *H01L 29/20* (2006.01)
  *H01L 33/00* (2010.01)
  *H01L 33/50* (2010.01)
  *H01L 25/075* (2006.01)

(52) U.S. Cl.
  CPC ........ *H01L 33/504* (2013.01); *H01L 25/0753* (2013.01)

(58) Field of Classification Search
  CPC . H01L 2224/48091; H01L 2924/00014; H01L 25/0753; H01L 33/486; H01L 33/505; H01L 33/58; H01L 33/64; H01L 2924/12041; H01L 2924/181; H01L 33/50; H01L 33/502; H01L 33/504; E02D 3/12
  See application file for complete search history.

(56) References Cited

U.S. PATENT DOCUMENTS

| | | | | |
|---|---|---|---|---|
| 2010/0068697 A1* | 3/2010 | Shih | ...................... | G01N 29/022 435/5 |
| 2010/0219428 A1* | 9/2010 | Jung | ......................... | F21K 9/00 257/89 |
| 2013/0105835 A1* | 5/2013 | Wu | ...................... | H01L 25/0753 257/89 |
| 2015/0108491 A1* | 4/2015 | Lu | ........................... | H01L 33/50 257/76 |

\* cited by examiner

*Primary Examiner* — Duy T Nguyen
(74) *Attorney, Agent, or Firm* — CKC & Partners Co., Ltd.

(57) ABSTRACT

A light-emitting diode package element includes a substrate, a plurality of light-emitting dies arranged on the substrate, and a second wavelength-conversion layer. Some of the light-emitting dies are covered with first wavelength-conversion layers thereon, respectively. The first wavelength-conversion layers convert into light with a first color temperature. The second wavelength-conversion layer covers the substrate, the light-emitting dies, and the first wavelength-conversion layers, and converts into light with second color temperature different to the light with the first color temperature.

14 Claims, 3 Drawing Sheets

LIGHT-EMITTING DIODE PACKAGING ELEMENT FOR CONTROLLING COLOR TEMPERATURE OF LIGHTS

This application claims priority to Taiwanese Application Serial Number 104109809, filed Mar. 26, 2015, which is herein incorporated by reference.

BACKGROUND

Field of Invention

The present invention relates to a package element. More particularly, the present invention relates to a light-emitting diode package element capable of producing lights with expected color temperatures.

Description of Related Art

Due to the advantages of traditional white light light-emitting diodes (LED), such as low power consumption, a low driving voltage, an expected long life, and environmental protection, among other advantages, the traditional white light LEDs have gradually being used for a various lighting devices and backlight LCD displays, and have become one of the most important light-emitting elements currently. A white light with a high color rendering index (CRI) has been the goal of the development of semiconductor light sources.

Color or color temperature of the light-emitting element of the traditional white light LED is unchangeable, and the traditional white light LEDs even have a high color temperature. It cannot adjust color temperature to reach an expected color or color temperature, and cannot attain homogeneous blending light. Hence, it needs to replace a suitable light-emitting element to produce light with the expected color temperature. In doing so, this may lead to generating additional design costs and procurement funds.

Thus, there are still some inconveniences and defects for the traditional white light LED, which are yet to be further improved. Therefore, how to effectively solve the inconveniences and defects is one of the most important issues currently, and has become the goal in the relevant art of things which need to be improved.

SUMMARY

Thus, the disclosure herein provides a light-emitting diode (LED) package element to solve the problem shown in the related art.

One of the embodiments in the disclosure provides a light-emitting diode package element. The light-emitting diode package element includes a substrate, a plurality of light emitting dies, a plurality of first wavelength-conversion layers, and a second wavelength-conversion layer. The substrate has a die-attaching area. The light emitting dies are arranged on the substrate. The first wavelength-conversion layers cover some of the light-emitting dies respectively, wherein each of the first wavelength-conversion layers is configured to convert into lights with a first color temperature. The second wavelength-conversion layer covers the die-attaching area, the light-emitting dies, and the first wavelength-conversion layers. The second wavelength-conversion layer is configured to convert into light with a second color temperature, wherein the first color temperature is different from the second color temperature.

One of the embodiments in the disclosure provides a light-emitting diode package element. The light-emitting diode package element includes a substrate, at least one light-emitting unit, a plurality of second light-emitting dies, and a second wavelength-conversion layer. The substrate has a die-attaching area. The light-emitting unit includes a first light-emitting die and a first wavelength-conversion layer. The first light-emitting dies are disposed on the die-attaching area. The first wavelength-conversion layer covers the first light-emitting die and is configured to convert into light with a first color temperature. The second light-emitting dies are arranged on the die-attaching area without being covered by the first wavelength-conversion layer. The second wavelength-conversion layer covers the die-attaching area, at least one light-emitting unit, and the second light-emitting dies. The second wavelength-conversion layer is configured to convert into light with a second color temperature, wherein the first color temperature is different from the second color temperature.

Thus, the disclosure herein provides a LED package element which can produce white light with various color temperatures by matching the two aforementioned light-emitting dies with various luminous intensities. Blending the white light can produce expected color temperatures of light emitted from the LED package element. In doing so, the disclosure herein will solve the problem of high color temperatures and inhomogeneous blending of light for the traditional LED. At the same time, the LED package element can reach a good dissipation of heat, protect light-emitting dies, and extend the lifetime of light-emitting dies owing to the first wavelength-conversion layers directly covering the light-emitting dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosures feature of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Figure 1:
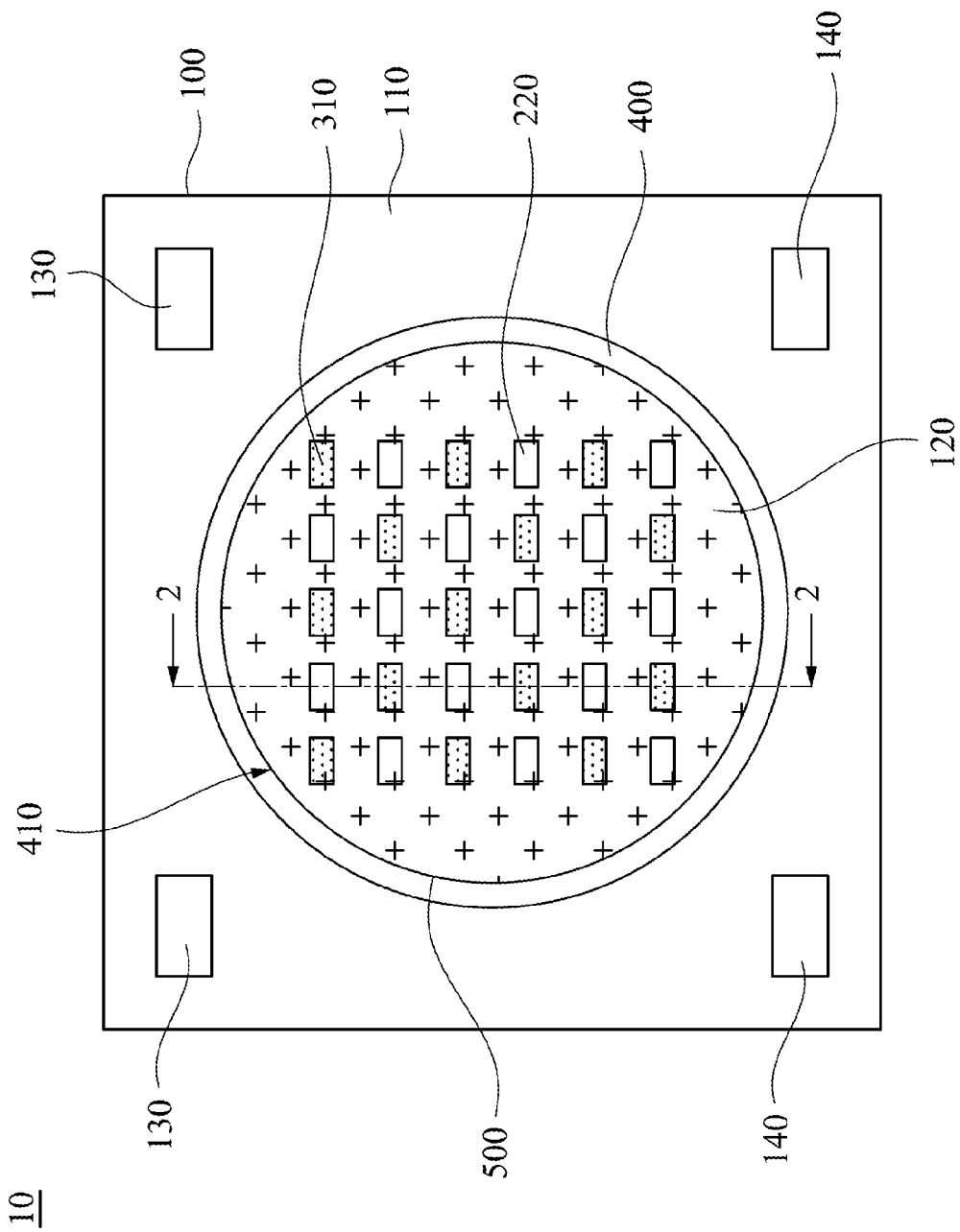
FIG. 1 is a top view of a light-emitting diode package element in accordance with some embodiments of the present disclosure.
Figure 2:
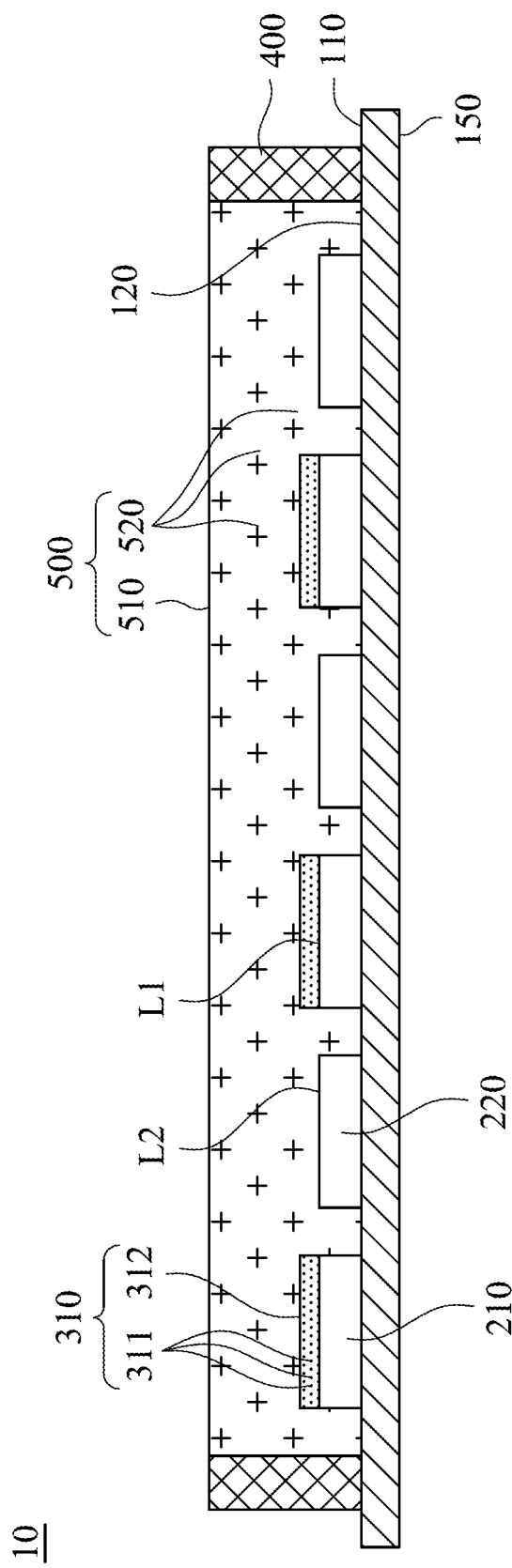
FIG. 2 is a cross-sectional view of the light-emitting diode package element taken along line 2-2 in FIG. 1 in accordance with some embodiments of the present disclosure.

Reference is made to FIG. 1 and FIG. 2. FIG. 1 is a top view of a light-emitting diode package element 10 in accordance with some embodiments of the present disclosure. FIG. 2 is a cross-sectional view of the light-emitting diode package element 10 taken along line 2-2 in FIG. 1 in accordance with some embodiments of the present disclosure. In some embodiments, the light-emitting diode package element (LED) 10 includes a substrate 100, a plurality of first light-emitting dies 210, 220, a plurality of first wavelength-conversion layers 310, and a second wavelength-conversion layer 500. The substrate 100 includes a first surface 110 and a second surface 150 opposite to each other. The substrate 100 has a die-attaching area 120 on the first surface 110. The LED package element 10 further includes a barricading part 400. The barricading part 400 is disposed on and protruded from the first surface 110. Furthermore, the barricading part 400 is disposed around a die-attaching area 120 to from a recess 410 that exposes the die-attaching area 120. Some of the light-emitting dies 210 are referred to as first light-emitting dies thereafter, and rest of the light-emitting dies 220 are referred to as second light-emitting dies thereafter. The first wavelength-conversion layers 310 cover, or may adhere, to the first light-emitting dies 210. In other words, the first wavelength-conversion layers 310 not cover the second light-emitting dies 220. Each of the first light-emitting dies 210 and each of the second light-emitting dies 220 are fixed on the die-attaching area 120 by the method, such as die bonding. Furthermore, each of the first light-emitting dies 210 and each of the second light-emitting dies 220 are electrically disposed on the die-attaching area 120 by the method of wire-bonding. For example, each of the first light-emitting dies 210 and each of the second light-emitting dies 220 are blue light LED dies whose wavelength is in a range from 360 nm to 480 nm. More specifically, the first wavelength-conversion layers 310 cover top surfaces L1 of the first light-emitting dies 210 respectively, and the forgoing elements form a light-emitting unit . A second wavelength-conversion layer 500 is filled in the recess 410, and covers the die-attaching area 120, the first light-emitting dies 210, the second light-emitting dies 220, and the first wavelength-conversion layers 310.

Therefore, the first wavelength-conversion layers 310 convert most of wavelengths of lights of the first light-emitting dies 210 into light with a first color temperature respectively during the first light-emitting dies 210 emitting the light. At the same time, the second wavelength-conversion layer 500 converts most of wavelengths of light of the second light-emitting dies 220 into the light with a second color temperature respectively during the second light-emitting dies 220 emitting the light. The second color temperature is different from the first color temperature. For example, in some embodiments, the first color temperature is in a range from 1000 K to 4999 K, and the second color temperature is in a range from 5000 K to 10000 K. At least some of the light with the first color temperature can blend with at least some of the light with the second color temperature into an expected color temperature between the first color temperature and the second color temperature due to the first color temperature is lower than the second color temperature.

Hence, the first light-emitting dies 210 with the first wavelength-conversion layers 310 combined with the second light-emitting dies 220 without the first wavelength-conversion layers 310 can produce white light with different color temperatures respectively. Furthermore, an expected color temperature can be produced by blending and adjusting the white light aforementioned.

Furthermore, in some embodiments, the first light-emitting dies 210 and the second light-emitting dies 220 have independent circuit for each other, such that the first light-emitting dies 210 and the second light-emitting dies 220 can be controlled independently. In doing so, users can drive the first light-emitting dies 210 to emit lights independently. Alternatively, users can drive the second light-emitting dies 220 to emit light independently, or can drive both of the light-emitting dies 210, 220 at the same time. Furthermore, users can also control the first light-emitting dies 210 or/and the second light-emitting dies 220 in an arbitrary percentage of the luminous intensities of light.

Specifically, the substrate 10 further includes two first electrodes 130 (positive and negative) and two second electrodes 140 (positive and negative). The first electrodes 130 and the second electrodes 140 are independently configured to connect to a power control circuit respectively (not shown in the Figure). The first light-emitting dies 210 are electrically connected in series to the first electrodes 130, such that the first light-emitting dies 210 can be driven to emit light by the power control circuit. The second light-emitting dies 220 are electrically connected in series to the second electrodes 140, such that the second light-emitting dies 220 also can be driven to emit light by the power control circuit.

Take the first color temperature with 2000 K and the second color temperature with 5700 K as an example If the luminous intensity of the first light-emitting dies 210 is 100% but without driving the second light-emitting dies 220 (i.e. 0% of the luminous intensity) by the power control circuit, then the light with the first color temperature and the light with the second color temperature can be blended into the light with the color temperature, 2200 K. Alternatively, if the luminous intensity of the first light-emitting dies 210 is 50%, and of the second light-emitting dies 220 is 50% adjusting by the power control circuit, then the light of the first color temperature and the light of the second color temperature can be blended into the light with the color temperature, 4000 K. Alternatively, if the luminous intensity of the first light-emitting dies 210 is 30%, and of the second light-emitting dies 220 is 70% adjusting by the power control circuit, then the light of the first color temperature and the second color temperature can be blended into the light with the color temperature, 4500 K. Alternatively, if the luminous intensity of the first light-emitting dies 210 is 20%, and of the second light-emitting dies 220 is 80% adjusting by the power control circuit, then the light of the first color temperature and the light of the second color temperature can be blended into the light with the color temperature, 5000 K.

Moreover, in some embodiments, the first light-emitting dies 210 have a first quantity. The second light-emitting dies 220 have a second quantity. The first quantity is equal to or smaller than the second quantity. For example, the proportion of the first quantity to the second quantity can be 1:1, 1:2, 1:3, 1:4, or 1:5, etc. However, these are, of course, merely examples and are not intended to be limiting. In other embodiments, the first quantity may smaller than the second quantity for the sake of limiting or demanding of the color temperatures.

More specifically, for example, in some embodiments, the first wavelength-conversion layers 310 can be phosphor-containing layers. Each of the firstwavelength-conversion layers 310 includes a first sheet 311 and a plurality of first fluorescent powders 312. The first sheet 311 covers a top surface L1 of one of the first light-emitting dies 210. The forgoing first fluorescent powders 312 can be phosphor, such as YAG, TAG, BOSE, Silicate, etc. The first fluorescent powders 312 distribute in the first sheet 311, and have wavelengths of light emitted in a range from 580 nm to 670 nm. This may be configured to convert into light with the first color temperature. The first fluorescent powders 312 may be in a color, such as yellow, or chartreuse, or approximate chartreuse. The phosphor-containing layers are formed by, for example, dry-press process, extrusion method, unidirectional solidification method, injection molding, or tape casting method, and the aforementioned methods are not intended to be limiting.

The second wavelength-conversion layer 500 is made of a cured light transparent plastic material covering the partial substrate 100, the first light-emitting dies 210, and the second light-emitting dies 220. The second wavelength-conversion layer 500 includes a single body 510. The single body 510 is referred to as being formed on the entire die-attaching area 120 by one time, and covering the partial substrate 100, the first light-emitting dies 210, the second light-emitting dies 220, and the first wavelength-conversion layers 310. The single body 510 directly contacts the substrate 100, surfaces of the first light-emitting dies 210, surfaces of the second light-emitting dies 220 (including a top surface L2), and the first wavelength-conversion layers 310. The single body 510 fixes the substrate 100, the first light-emitting dies 210, the second light-emitting dies 220, and the first wavelength-conversion layers 310. Furthermore, the single body 510 includes a second fluorescent powders 520 distributed homogeneously therein. The second fluorescent powders 520 are configured to convert into lights with the second color temperature. The second fluorescent powders 520 can be phosphor, such as YAG, TAG, BOSE, Silicate, etc. The second fluorescent powders 520 have wavelengths of lights emitting in a range from 520 nm to 580 nm. The second fluorescent powders 520 may be in a color, such as yellow or chartreuse, or approximate chartreuse. Moreover, the second wavelength-conversion layer 500 including the second fluorescent powders 520 are formed by, for example, dry-press process, extrusion method, unidirectional solidification method, injection molding, or tape casting method, and the aforementioned methods are not intended to be limiting.

In some embodiments, the substrate 100 is a metal substrate. The substrate 100 also can be a copper substrate, or an aluminum substrate. In the actual implementation, the substrate 100 also can be a printed circuit board, metal core printed circuit board (MCPCB), ceramic substrate, or other substrates having good electrical and thermal conductivity. The substrate having good thermal conductivity can quickly transfer away the heat generated from the light-emitting dies. This can avoid the problem in which the temperature may be too high which may impact the lifetime of the light-emitting die, or efficiency and stability of lights. Furthermore, the appearance of the substrate 100 is not intended to be limiting, for example, the appearance can be rectangular, polygonal or circular, etc.

In FIG. 1 and FIG. 2, the first light-emitting dies 210 and the second light-emitting dies 220 are arranged in a matrix, and further arranged in a staggered manner by each other. In doing so, the blending of the emitted light has a more homogeneous status, so as to provide adequate white light quality in an appropriate range of color temperatures.

However, it is noted that, the arrangement shown above are merely examples and are not intended to be limiting. Those skilled in the art should choose arrangement manners of the first light-emitting dies 210 and the second light-emitting dies 220 depending on actual needs or restrictions.

Figure 3:
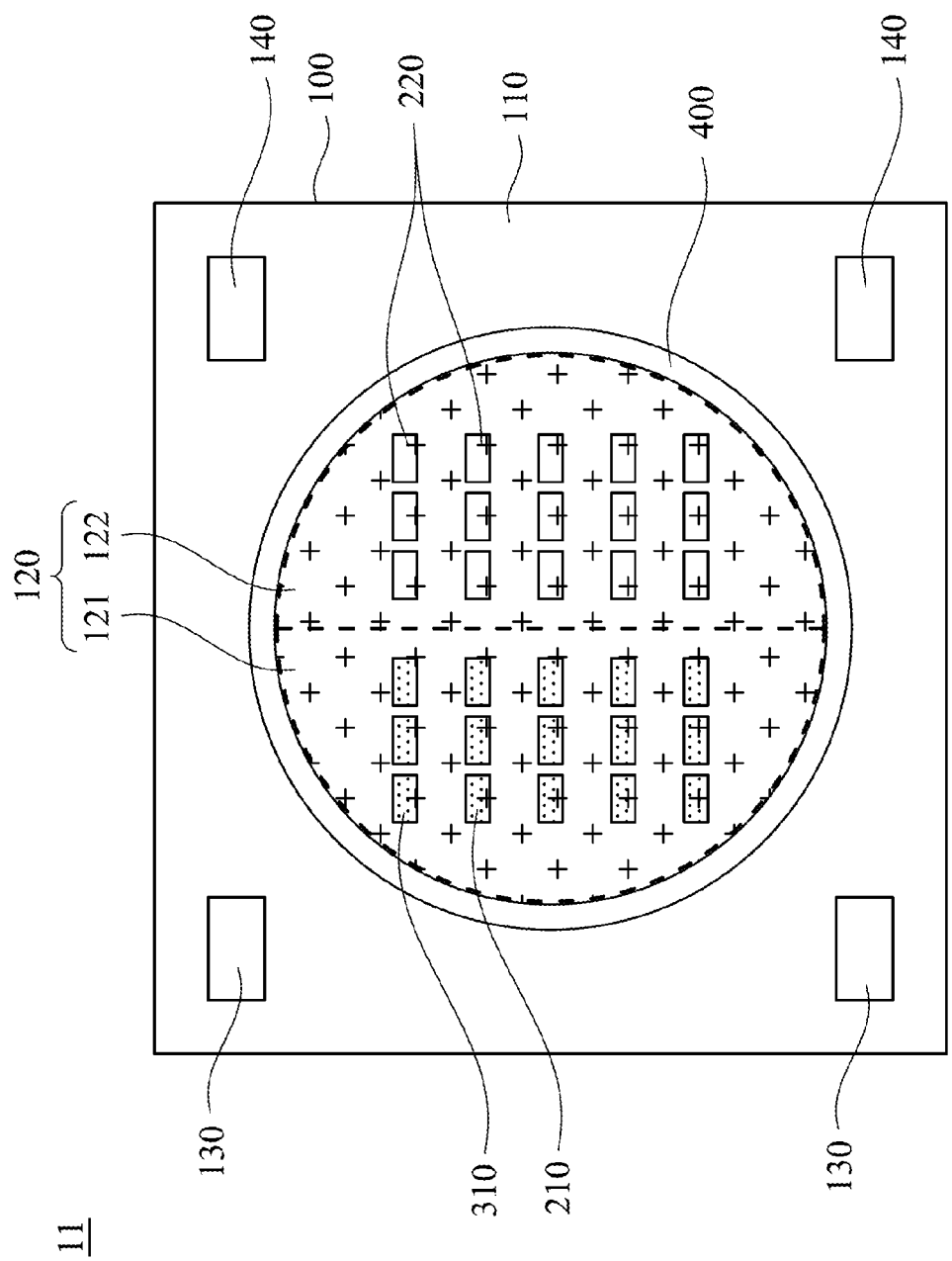
FIG. 3 is a top view of a light-emitting diode package element in accordance with some other embodiments of the present disclosure.

FIG. 3 is a top view of a light-emitting diode (LED) package element 11 in accordance with some embodiments of the present disclosure. In FIG. 3, the embodiment of the LED package element 11 is substantially the same as that aforementioned in the FIG. 2, and one difference is that the die-attaching area is divided into a first area 121 and a second area 122 adjacent to each other. The first area 121 is disposed between the first electrodes 130 (positive and negative) and the second area 122. The second area 122 is disposed between the second electrodes 140 (positive and negative) and the second area 122. The first light-emitting dies 210 are arranged on the first area 121 of the die-attaching area 120. The second light-emitting dies 220 are arranged on the second area 122 of the die-attaching area 120. Hence, the first light-emitting dies 210 are separated from the second light-emitting dies 220. This can enhance the convenience of circuit arrangements between the first light-emitting dies 210 and the first electrodes 130 (positive and negative), and of circuit arrangements between the second light-emitting dies 220 and the second electrodes 140 (positive and negative), and further reduce manufacturing costs and time.

Hence, according to some embodiments of the present disclosure, the LED package element can provide more various choices by more various color temperatures. In doing so, the LED package element can be adjusted to reach more accurate expected color temperatures of emitted light, and can solve the problem of high color temperature and inhomogeneous blending of light of the traditional LED.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A light-emitting diode package element comprising:
   a substrate having a die-attaching area;
   a plurality of first light-emitting dies arranged on the substrate;
   a plurality of first wavelength-conversion layers respectively covering the first light-emitting dies, wherein each of the first wavelength-conversion layers is configured to convert into light with a first color temperature;
   a plurity of second light-emitting dies without being covered by the first wavelength-conversion layer, which are arranged on the substrate between the first light-emitting dies, wherein a first quantity of the first light-emitting dies is smaller than a second quantity of the second light-emitting dies; and
   a second wavelength-conversion layer directly covering the die-attaching area, the first light-emitting dies, the second light-emitting dies and the first wavelength-conversion layers, the second wavelength-conversion layer being configured to convert into light with a second color temperature, wherein the first color temperature is different from the second color temperature.
2. The light-emitting diode package element of claim 1, wherein each of the first wavelength-conversion layers comprises:
   a sheet covering one of the first light-emitting dies; and a plurality of fluorescent powders distributed in the sheet and configured to convert into lights with the first color temperature.

3. The light-emitting diode package element of claim 1, wherein the second wavelength-conversion layer comprises:
   a body directly covering the die-attaching area, the first light-emitting dies, the second light-emitting dies and the first wavelength-conversion layers; and
   a plurality of fluorescent powders distributed in the body and configured to convert into light with the second color temperature.

4. The light-emitting diode package element of claim 1, wherein the first color temperature is in a range from 1000 K to 4999 K, and the second color temperature is in a range from 5000 K to 10000 K.

5. The light-emitting diode package element of claim 1, wherein the first light-emitting dies and the second light-emitting dies are controlled independently.

6. The light-emitting diode package element of claim 1, wherein the first light-emitting dies and the second light-emitting dies are arranged in a staggered manner.

7. The light-emitting diode package element of claim 1, wherein the first light-emitting dies are arranged on a first region of the die-attaching area, the second light-emitting dies are arranged on a second region of the die-attaching area, and the first region is adjacent to the second region.

8. A light-emitting diode package element comprising:
   a substrate having a die-attaching area;
   at least one light-emitting unit comprising:
      a first light-emitting die disposed on the die-attaching area; and
      a first wavelength-conversion layer covering the first light-emitting die and configured to convert into lights with a first color temperature;
   a plurality of second light-emitting dies arranged on the die-attaching area without being covered by the first wavelength-conversion layer, wherein the first light-emitting die is arranged between the second light-emitting dies, and a first quantity of the first light-emitting die of the at least one light-emitting unit is smaller than a second quantity of the second light-emitting dies; and
   a second wavelength-conversion layer directly covering the die-attaching area, the first light-emitting die, the first wavelength-conversion layer and the second light-emitting dies, the second wavelength-conversion layer being configured to convert into lights with a second color temperature, wherein the first color temperature is different from the second color temperature.

9. The light-emitting diode package element of claim 8, wherein the first wavelength-conversion layer comprises:
   a sheet covering the first light-emitting die; and
   a plurality of fluorescent powders distributed in the sheet and configured to convert into light with the first color temperature.

10. The light-emitting diode package element of claim 8, wherein the second wavelength-conversion layer comprises:
    a body directly covering the at least one light-emitting unit and the second light-emitting dies ; and
    a plurality of fluorescent powders distributed in the body and configured to convert into lights with the second color temperature.

11. The light-emitting diode package element of claim 8, wherein the first color temperature is in a range from 1000 K to 4999 K, and the second color temperature is in a range from 5000 K to 10000 K.

12. The light-emitting diode package element of claim 8, wherein the first light-emitting die of the at least one light-emitting unit and the second light-emitting dies are controlled independently.

13. The light-emitting diode package element of claim 8, wherein the first light-emitting die of the at least one light-emitting unit and the second light-emitting dies are arranged in a staggered manner.

14. The light-emitting diode package element of claim 8, wherein the first light-emitting die of the at least one light-emitting unit is arranged on a first region of the die-attaching area, the second light-emitting dies are arranged on a second region of the die-attaching area, and the first region is adjacent to the second region.

* * * * *